United States Patent
Xia et al.

(10) Patent No.: US 9,550,668 B1
(45) Date of Patent: Jan. 24, 2017

(54) INTEGRATED MEMS PRESSURE SENSOR AND MEMS INERTIAL SENSOR

(71) Applicant: GLOBALFOUNDRIES Singapore Pte. Ltd., Singapore (SG)

(72) Inventors: Jia Jie Xia, Singapore (SG); Nagarajan Ranganathan, Singapore (SG); Rakesh Kumar, Singapore (SG); Aveek Nath Chatterjee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/834,498

(22) Filed: Aug. 25, 2015

(51) Int. Cl.
- *H01L 29/84* (2006.01)
- *B81B 7/02* (2006.01)
- *B81C 1/00* (2006.01)

(52) U.S. Cl.
CPC ............. *B81B 7/02* (2013.01); *B81C 1/00269* (2013.01); *B81C 1/00301* (2013.01); *H01L 29/84* (2013.01); *B81B 2201/0228* (2013.01); *B81B 2201/0235* (2013.01); *B81B 2201/0242* (2013.01); *B81B 2201/0264* (2013.01); *B81B 2203/0127* (2013.01); *B81B 2203/0136* (2013.01); *B81B 2207/092* (2013.01); *B81B 2207/094* (2013.01); *B81C 2201/013* (2013.01); *B81C 2203/0109* (2013.01)

(58) Field of Classification Search
None
See application file for complete search history.

(56) References Cited

U.S. PATENT DOCUMENTS

| | | | | |
|---|---|---|---|---|
| 7,540,199 B2* | 6/2009 | Fujii | .......................... | B81B 7/02 324/661 |
| 2005/0218488 A1* | 10/2005 | Matsuo | ............... | B81C 1/00095 257/678 |
| 2007/0029629 A1* | 2/2007 | Yazdi | .................. | B81C 1/00253 257/414 |
| 2011/0126632 A1* | 6/2011 | McNeil | ..................... | B81B 7/02 73/718 |
| 2012/0032283 A1* | 2/2012 | Frey | ..................... | G01P 15/0802 257/415 |
| 2013/0340525 A1* | 12/2013 | Liu | ..................... | G01P 15/0802 73/514.11 |
| 2015/0008542 A1* | 1/2015 | Kaelberer | .............. | H04R 19/04 257/416 |
| 2015/0198493 A1* | 7/2015 | Kaelberer | ........... | G01P 15/0802 73/718 |

FOREIGN PATENT DOCUMENTS

| CN | 103712720 A | 4/2014 |
|---|---|---|
| EP | 2693182 A1 | 2/2014 |

* cited by examiner

Primary Examiner — Stephen W Smoot
(74) Attorney, Agent, or Firm — Lorenz & Kopf, LLP

(57) ABSTRACT

Integrated MEMS devices for pressure sensing and inertial sensing, methods for fabricating such integrated devices, and methods for fabricating vertically integrated MEMS pressure sensor/inertial sensor devices are provided. In an example, a method for fabricating an integrated device for pressure and inertial sensing includes forming a MEMS pressure sensor on a first side of a semiconductor substrate. The method further includes forming a MEMS inertial sensor on a second side of the semiconductor substrate. The second side of the semiconductor substrate is opposite the first side of the semiconductor substrate.

20 Claims, 10 Drawing Sheets

INTEGRATED MEMS PRESSURE SENSOR AND MEMS INERTIAL SENSOR

TECHNICAL FIELD

The technical field generally relates to Micro-Electro-Mechanical-Systems (MEMS) devices, and more particularly relates to integrated devices with MEMS pressure sensors and MEMS inertial sensors and methods for fabricating such devices.

BACKGROUND

Microminiature sensors have been achieved with the development of the Micro-Electro-Mechanical-System (MEMS) technique. The most widely used sensors mainly include MEMS pressure sensors and MEMS inertial sensors. MEMS pressure sensors are devices for sensing pressure and are widely used in various fields, for example, automotive electronics such as Tire Pressure Monitoring System (TPMS), consumer electronics such as tire pressure gauge and blood pressure gauge, industrial electronics such as digital pressure gauge, digital flow meter and industrial batch weighting. MEMS inertial sensors are devices that perform measurement by using inertial forces. In practical application, a MEMS inertial sensor generally refers to an accelerometer or a gyroscopic apparatus (which is also referred to as a gyroscope). According to different sensing principles, the MEMS inertial sensor may be classified as a piezoresistance sensor, a capacitive sensor, a piezoelectric sensor, a tunneling current sensor, a resonant sensor, a thermoelectric coupling sensor, an electromagnetic sensor, and the like. MEMS inertial sensors are generally applied to portable devices such as mobile phones or game devices in the consumer electronic field; to automotive electronic stability systems (ESP or ESC) such as automobile airbags or vehicle gesture measurement systems; to GPS assistant navigation systems; and to communication satellite radio systems.

While various independent sensors have been widely used in consumer electronics, automotive electronics and industrial electronics, integration of different types of sensor as an integrated device has been problematic. Specifically, there are significant differences in manufacture and package method among various sensors. Typically, MEMS inertial sensors and MEMS pressure sensors may be designed and manufactured separately and then packaged together. This requires complicated processing, a large package size and a high cost.

Accordingly, it is desirable to provide a method for fabricating an integrated MEMS device for pressure sensing and inertial sensing. Further, it is desirable to provide an improved integrated MEMS device for pressure sensing and inertial sensing. Also, it is desirable to provide an improved method for fabricating vertically integrated MEMS pressure sensor/inertial sensor devices. Furthermore, other desirable features and characteristics will become apparent from the subsequent detailed description and the appended claims, taken in conjunction with the accompanying drawings and this background.

BRIEF SUMMARY

Integrated MEMS devices for pressure sensing and inertial sensing, methods for fabricating such integrated devices, and methods for fabricating vertically integrated MEMS pressure sensor/inertial sensor devices are provided. In an embodiment, a method for fabricating an integrated device for pressure and inertial sensing includes forming a MEMS pressure sensor on a first side of a semiconductor substrate. The method further includes forming a MEMS inertial sensor on a second side of the semiconductor substrate. The second side of the semiconductor substrate is opposite the first side of the semiconductor substrate.

In another embodiment, a method for fabricating a vertically integrated MEMS pressure sensor/inertial sensor device is provided and includes providing a semiconductor substrate, processing a first side of the semiconductor substrate to form a MEMS pressure sensor, and processing a second side of the semiconductor substrate to form a MEMS inertial sensor.

Another embodiment includes an integrated MEMS device for pressure sensing and inertial sensing. The integrated MEMS device includes a substrate having a first side and a second side opposite the first side. The integrated MEMS device also includes a MEMS pressure sensor located on the first side of the semiconductor substrate. Further, the integrated MEMS device includes a MEMS inertial sensor located on the second side of the semiconductor substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIGS. 1-8 illustrate exemplary steps for the formation of a MEMS pressure sensor on a first side of a first semiconductor substrate in accordance with an embodiment herein;

FIGS. 9-10 illustrate exemplary steps for the processing of a second semiconductor substrate for bonding over the first side of the first semiconductor substrate of FIGS. 1-8, in accordance with an embodiment herein;

FIGS. 11-14 illustrate exemplary steps for the bonding the second semiconductor substrate of FIGS. 9-10 to the first side of the first semiconductor substrate of FIGS. 1-8 and for processing the second side of the first semiconductor substrate to form a MEMS inertial sensor in accordance with an embodiment herein;

FIGS. 15-18 illustrate exemplary steps for the processing of a third semiconductor substrate for bonding over the second side of the first semiconductor substrate of FIGS. 11-14, in accordance with an embodiment herein; and FIGS. 19-23 illustrate exemplary steps for the processing of the second semiconductor substrate and the third semiconductor substrate of FIGS. 15-18, in accordance with another embodiment herein.

DETAILED DESCRIPTION

Figure 1:
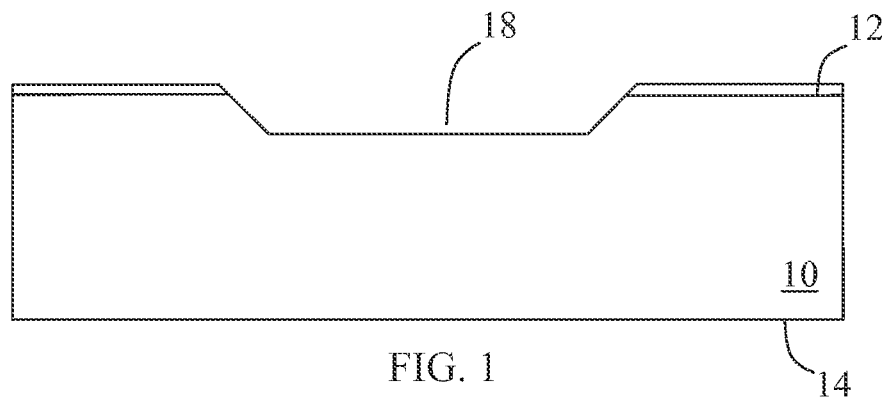
FIGS. 1-23 illustrate, in cross section, exemplary methods for fabricating an integrated MEMS device for pressure sensing and inertial sensing.

The following detailed description is merely exemplary in nature and is not intended to limit the integrated MEMS devices for pressure sensing and inertial sensing, methods for fabricating such integrated devices, or methods for fabricating vertically integrated MEMS pressure sensor/ inertial sensor devices. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in semiconductor processing and the fabrication of MEMS devices are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, a method is provided for forming an integrated device including a pressure sensor and an inertial sensor. In an exemplary embodiment, the pressure sensor is formed on a first side of a first semiconductor substrate. A second semiconductor substrate is then bonding over the pressure sensor on the first side of the first semiconductor substrate. The method forms the inertial sensor on the second side of the first semiconductor substrate. A third semiconductor substrate is then formed as a cap over the inertial sensor on the second side of the first semiconductor substrate. The method forms a vacuum cavity that is shared by the pressure sensor and the inertial sensor.

In the exemplary embodiment, the pressure sensor and inertial sensor are vertically aligned, thereby reducing their required chip size or footprint. Also, an exemplary integrated device includes a pressure sensor and an inertial sensor that each use the same capacitive sensing method, facilitating data read out and processing.

Further, using the methods herein can provide an integrated device with ten degrees-of-freedom. Specifically, the methods herein can be used to fabricate an integrated circuit including 3 inertial sensors and 1 pressure sensor that can measure acceleration in the X, Y and Z direction, angular velocity in the X, Y and Z direction, magnetic field in the X, Y and Z direction, and pressure. In one embodiment, an integrated device may be formed with a 3 axis gyrometer, 3 axis accelerometer, 3 axis magnetometer, and 1 axis scalar pressure sensor.

Figure 9:
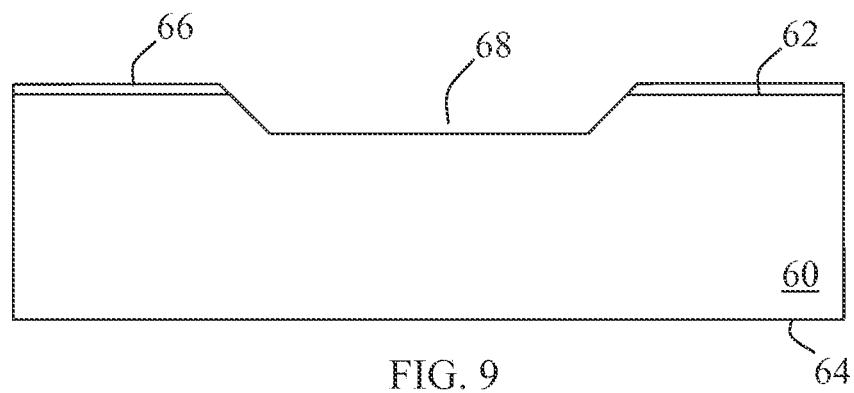
Figure 10:
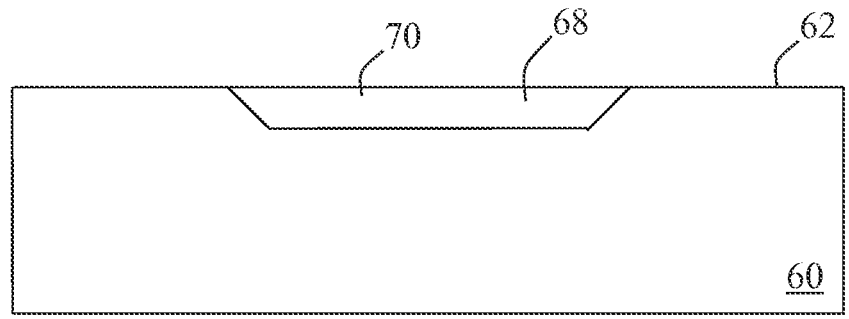

FIGS. 1-8 illustrate exemplary steps for the formation of a MEMS pressure sensor on a first side of a first semiconductor substrate in accordance with an embodiment herein. FIGS. 9-10 illustrate exemplary steps for the processing of a second semiconductor substrate for bonding over the first side of the first semiconductor substrate of FIGS. 1-8, in accordance with an embodiment herein. FIGS. 11-14 illustrate exemplary steps for the bonding the second semiconductor substrate of FIGS. 9-10 to the first side of the first semiconductor substrate of FIGS. 1-8 and for processing the second side of the first semiconductor substrate to form a MEMS inertial sensor in accordance with an embodiment herein. FIGS. 15-18 illustrate exemplary steps for the processing of a third semiconductor substrate for bonding over the second side of the first semiconductor substrate of FIGS. 11-14, in accordance with an embodiment herein. FIGS. 19-23 illustrate exemplary steps for the processing of the second semiconductor substrate and the third semiconductor substrate of FIGS. 15-18, in accordance with another embodiment herein.

In FIG. 1, a first semiconductor substrate 10 is provided and processed. It is to be appreciated that various fabrication techniques may be conducted in accordance with the methods described herein to form the semiconductor substrate 10 as shown. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 10 may include a compound semiconductor such as silicon carbide, silicon germanide, gallium arsenide, gallium nitride, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

An exemplary semiconductor substrate is formed by high resistivity silicon, such as silicon having resistivity greater than 40 ohm-cm. An exemplary semiconductor substrate 10 is a bulk silicon wafer. An exemplary semiconductor substrate has a thickness of from about 250 to about 1000 microns, such as from about 400 to about 600 microns. As shown the semiconductor substrate 10 includes a planar surface at side 12 and a planar surface at an opposite side 14. In the context of FIG. 1, side 12 may be considered to be an "upper" side and side 14 may be considered to be a "lower" side.

In FIG. 1, a recess process has been performed. Specifically, a mask 16 has been formed and patterned over side 12 of the semiconductor substrate 10. Then, an etch is performed, such as a plasma silicon etch or a wet etch, for example a wet etch using potassium hydroxide (KOH) or tetramethyl ammonium hydroxide (TMAH). The exemplary etch process is anisotropic and forms cavity 18 in the semiconductor substrate 10. The mask 16 is then removed.

Figure 2:
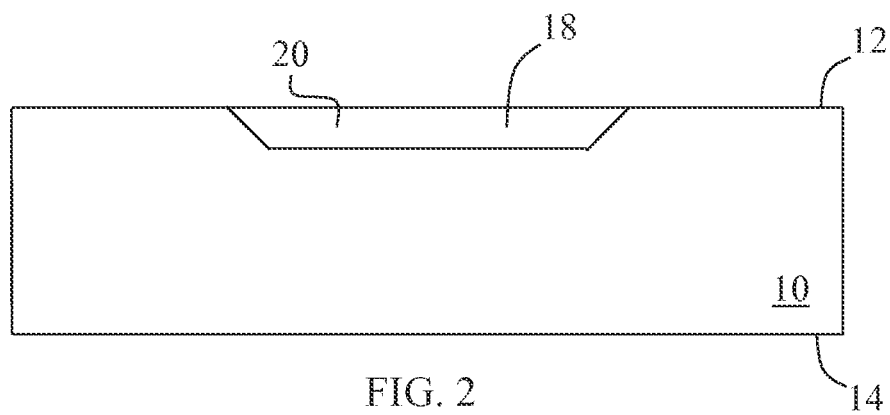

In FIG. 2, a sacrificial layer 20 is formed in the cavity 18. For example, the sacrificial layer 20 may be formed from silicon oxide material. In an exemplary embodiment, sacrificial material is deposited over side 12 of semiconductor substrate 10 and fills the cavity 18. Such a process forms an overburden portion of the sacrificial material over the surface of side 12. In an exemplary embodiment, the overburden portion is removed by a chemical mechanical planarization (CMP) process to form the sacrificial layer 20 within the cavity.

Figure 3:
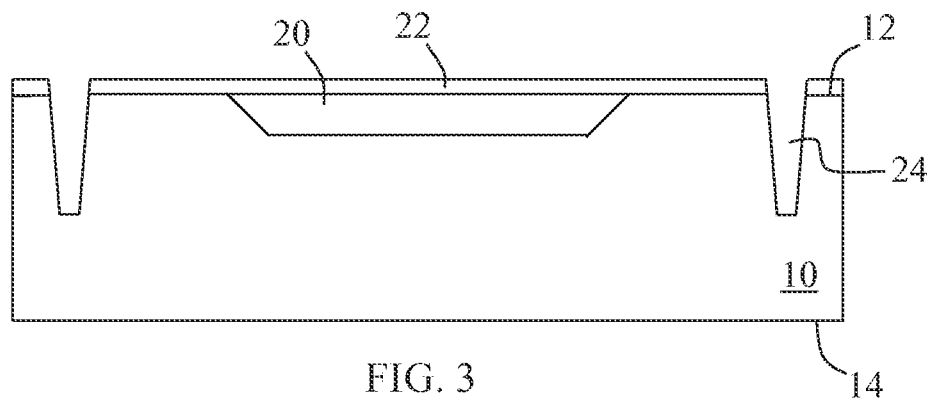

The exemplary method may continue in FIG. 3 with a via formation process. As shown, a mask is formed and patterned over side 12 of the semiconductor substrate 10. Then, blind vias 24 are etched into the semiconductor substrate 10. As shown, blind vias 24 extend through side 12 and toward side 14 of semiconductor substrate 10, but do not penetrate through to side 14 of semiconductor substrate 10. Blind vias 24 can be formed utilizing a number of conventionally-known processes, including deep reactive ion etching (DRIE).

Figure 4:
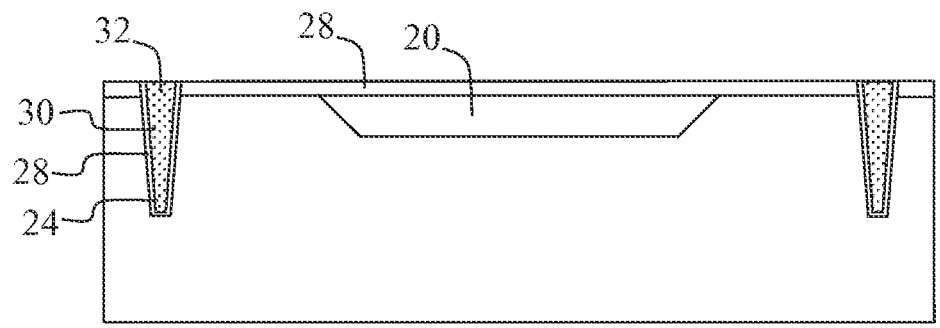

In FIG. 4, the mask 22 is removed and a liner 28 is formed on the side 12 of the semiconductor substrate 10, including within the blind vias 24. An exemplary liner 28 is formed by liner material, such as silicon oxide. In an exemplary embodiment, the liner material is deposited with a linear oxide deposition process, such as by chemical vapor deposition (CVD) or low pressure chemical vapor deposition (LPCVD).

After formation of the liner 28, the method may continue with the deposition of a conductive material to form a conductive plug 30 within each blind via 24. An exemplary conductive material is doped polysilicon. In an exemplary embodiment, the conductive material is deposited by an in-situ low pressure chemical vapor deposition (LPCVD) process. The conductive material is deposited to fill the blind vias 24 and may form an overburden portion over the side 12 of the semiconductor substrate 10. In FIG. 4, the overburden portion may be removed by a chemical mechanical planarization (CMP) and clean process. The liner 28 and conductive plug 30 may be considered to form a conductive interconnect 32 within each blind via 24.

Figure 5:
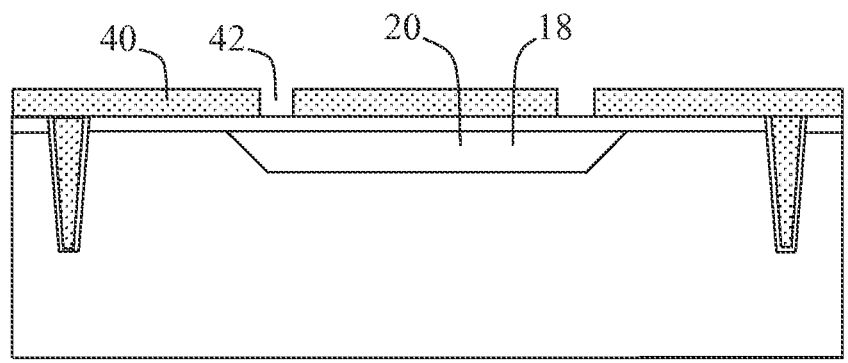

The method continues in FIG. 5 with formation of a conductive layer 40 over side 12 of the semiconductor substrate 10. An exemplary conductive layer 40 is formed with a conductive layer material such as polysilicon. In an exemplary embodiment, the polysilicon is deposited over side 12 of the semiconductor substrate 10 by a LPCVD process. After depositing the conductive layer material, a mask may be formed and patterned over the conductive layer material and the conductive layer material etched to form the conductive layer 40 with openings 42. The mask is then removed. Openings 42 are located over the cavity 18 and expose the sacrificial layer 20 therein.

Figure 6:
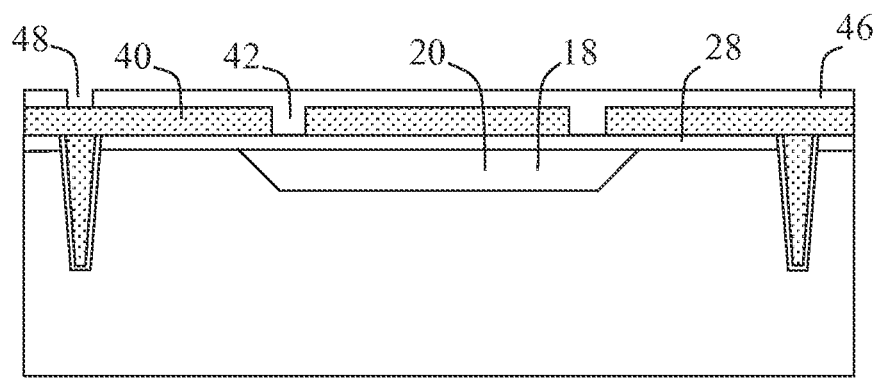

The method may continue in FIG. 6 with the formation of sacrificial layer 46 over the conductive layer 40. An exemplary sacrificial layer 46 is formed by a sacrificial material such as silicon oxide. In an exemplary embodiment, the sacrificial material is deposited by a CVD process. A planarization process such as CMP may be performed to planarize the sacrificial material. Then, a mask may be formed and patterned over the sacrificial material and an etch process performed to form opening 48 and define the sacrificial layer 46. The mask is then removed. As shown, the opening 48 may expose a portion of the conductive layer 40 lying over a conducive interconnect 32. Further, as shown, the sacrificial layer 46 fills the openings 42 formed within the conductive layer 40 and are in contact and merged with the liner 28 and sacrificial layer 20.

Figure 7:
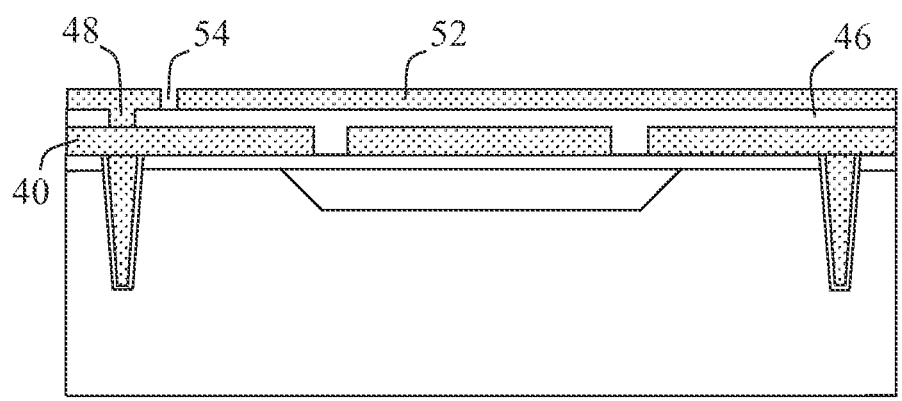

In FIG. 7, a membrane layer 52 is formed over the sacrificial layer 46. An exemplary membrane layer 52 is formed with a conductive material such as doped polysilicon. In an exemplary embodiment, a LPCVD process is performed to form in situ doped polysilicon. Then, a thermal anneal process may be performed to reduce the polysilicon mechanical stress and provide a low stress membrane layer 52, such as a membrane layer 52 having stress of less than about 50 MPa. After annealing the membrane layer 52, a mask may be formed and patterned over the membrane layer 52 and the membrane layer 52 etched to form an opening 54. The mask is then removed. As shown, the membrane layer 52 fills the opening 48 in the underlying sacrificial layer 46 and contacts the conductive layer 40.

Figure 8:
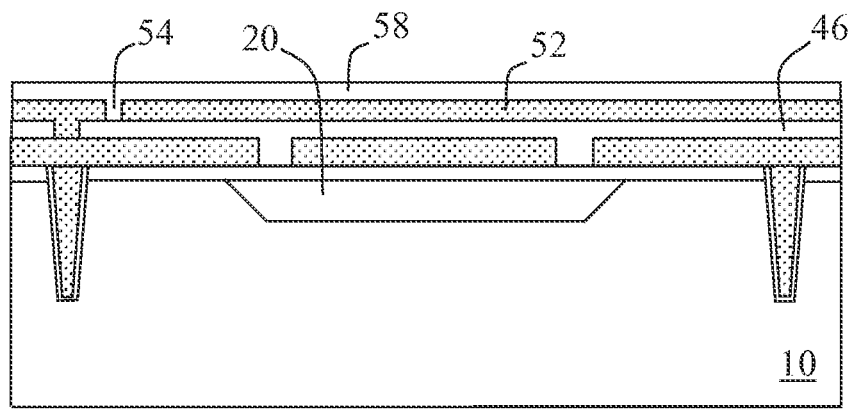

The method continues in FIG. 8 with the formation of sacrificial layer 58 over the membrane layer 52. An exemplary sacrificial layer 58 is formed by a sacrificial material such as silicon oxide. In an exemplary embodiment, the sacrificial material is deposited by a CVD process. A planarization process such as CMP may be performed to planarize the sacrificial material. As shown the sacrificial layer 58 fills the opening 54 in the membrane layer 52 and contacts the sacrificial layer 46.

FIGS. 1-8 illustrate initial processing to form a pressure sensor over first semiconductor substrate 10. FIGS. 9-10 illustrate processing of a second semiconductor substrate 60.

In FIG. 9, semiconductor substrate 60 is illustrated and may be of the type described above in relation to semiconductor 10, and may be similar or identical to semiconductor substrate 10. As shown, semiconductor substrate 60 includes a planar surface at side 62 and a planar surface at an opposite side 64. In the context of FIG. 9, side 62 may be considered to be an "upper" side and side 64 may be considered to be a "lower" side.

In FIG. 9, a recess process has been performed. Specifically, a mask 66 has been formed and patterned over side 62 of the semiconductor substrate 60. Then, an etch is performed, such as a plasma silicon etch or a wet etch, for example a wet etch using potassium hydroxide (KOH) or tetramethyl ammonium hydroxide (TMAH). The exemplary etch process is anisotropic and forms cavity 68 in the semiconductor substrate 60. The mask 66 is then removed.

In FIG. 10, a sacrificial layer 70 is formed in the cavity 68. For example, the sacrificial layer 70 may be formed from silicon oxide material. In an exemplary embodiment, sacrificial material is deposited over side 62 of semiconductor substrate 60 and fills the cavity 68. Such a process forms an overburden portion of the sacrificial material over the surface of side 62. In an exemplary embodiment, the overburden portion is removed by a CMP process to form the sacrificial layer 70 within the cavity.

Figure 11:
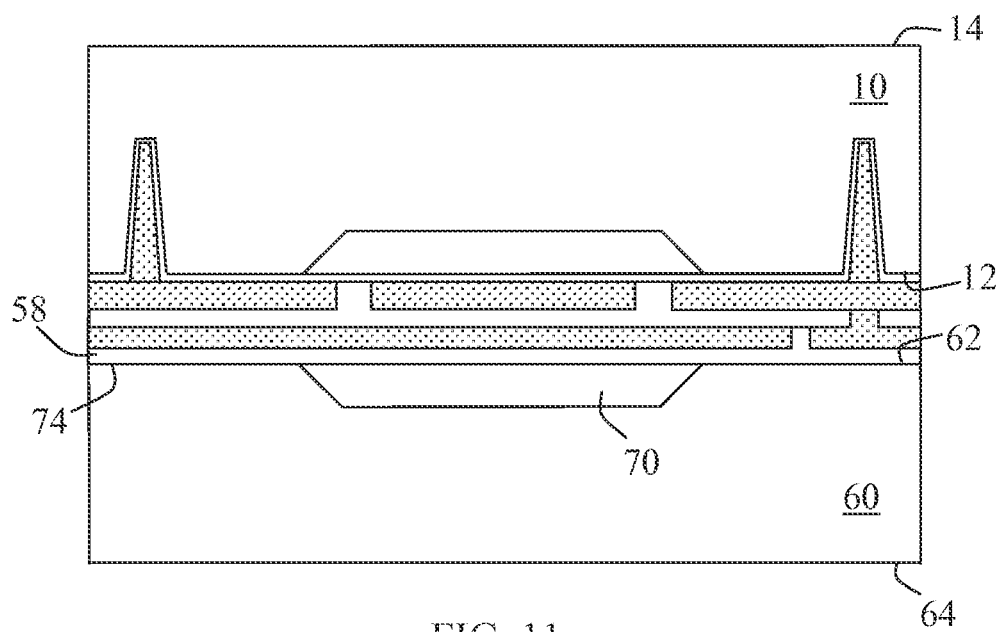

FIGS. 11-14 illustrate processing of the first semiconductor substrate 10 and second semiconductor substrate 60. In FIG. 11, first semiconductor substrate 10 and second semiconductor substrate 60 are bonded together at interface 74. Specifically, the side 62 of semiconductor substrate 60 and surface of sacrificial layer 70 are bonded to the sacrificial layer 58 of the first semiconductor substrate 10. In an exemplary embodiment, first semiconductor substrate 10 and second semiconductor substrate 60 are bonding together by fusion bonding, in which the sacrificial layer 58 of the first semiconductor substrate 10 is forced into contact with the side 62 of semiconductor substrate 60 and surface of sacrificial layer 70 and may be annealed to form a bond therebetween. Edge trimming may be performed to remove defects formed at the lateral edges of the bonded substrates 10 and 60.

Figure 12:
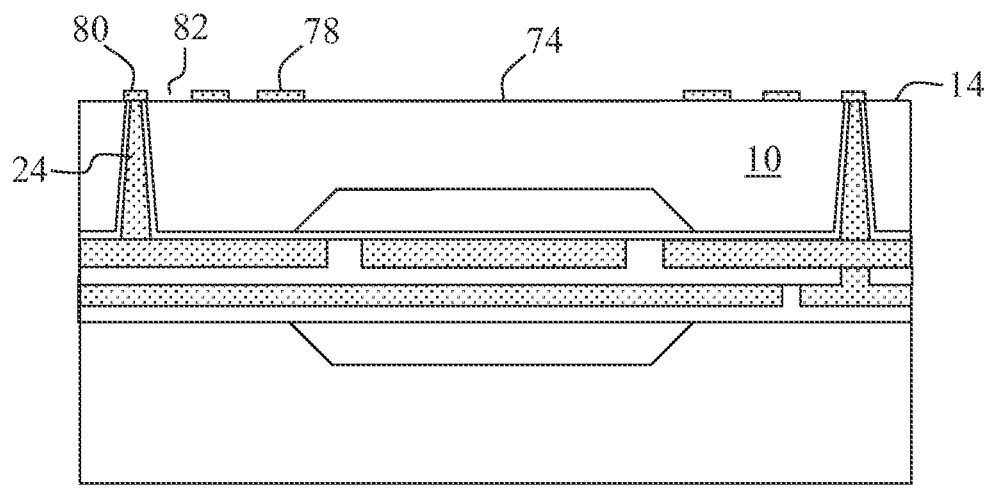

In FIG. 12, side 14 of semiconductor substrate 10 is recessed, such as by grinding or CMP, to a recessed surface 74. As shown, the recessed surface 74 intersects each blind via 24 and exposes the conductive interconnect 32 therein. A bonding layer 78 is then formed over the recessed surface 74. An exemplary bonding layer is formed from a bonding material such as germanium. In an exemplary embodiment, the bonding material is deposited by physical vapor deposition (PVD) or LPCVD. After depositing the bonding material, a mask may be formed and patterned over the bonding material and the bonding material etched to form the bonding layer 78 as bonding segments 80 separated by openings 82. The mask is then removed. A bonding segment 80 may be located over each conductive interconnect 32.

Figure 13:
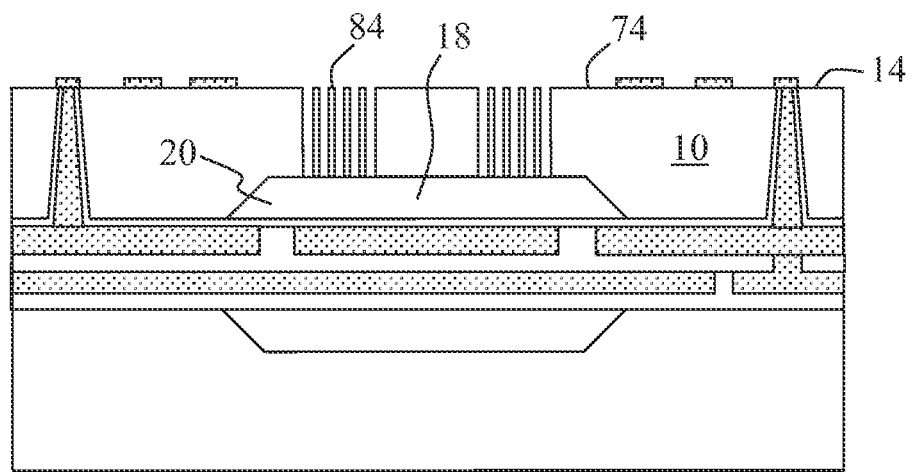

In FIG. 13 a comb structure 84 is formed in the semiconductor substrate 10. For example, a mask may be formed and patterned over the recessed surface 74 of side 14 of semiconductor substrate 10. Then, the semiconductor substrate 14 is etched as shown in FIG. 13 to form vias 84 that extend to the cavity 18, expose the sacrificial layer 20 therein, and define the comb structure of the semiconductor substrate 10.

Figure 14:
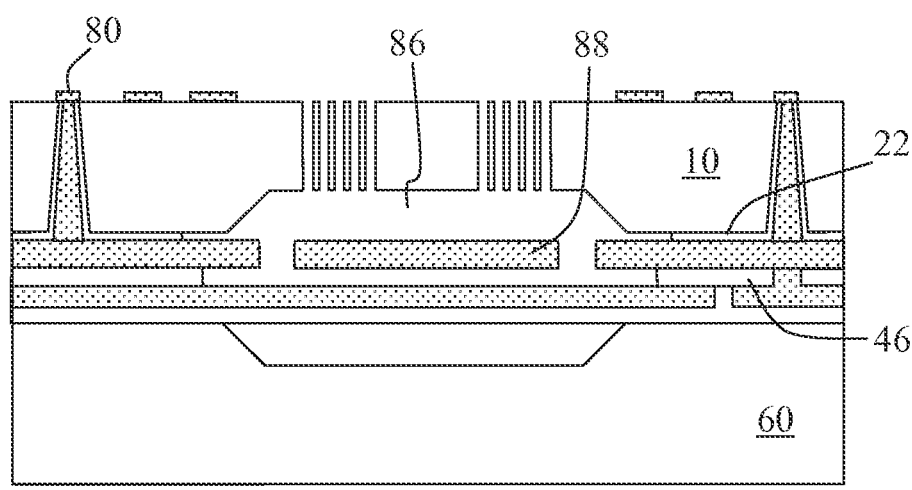

In FIG. 14, the sacrificial layer 20, a portion of liner 28, and a portion of sacrificial layer 46 are removed. For example, in an embodiment in which the sacrificial layer 20, liner 28, and sacrificial layer 46 are silicon oxide, a release etch is performed, such as with vapor hydrofluoric acid (VHF). As a result, a void 86 is formed around a backplate element 88 formed from the conductive layer 40.

Figure 15:
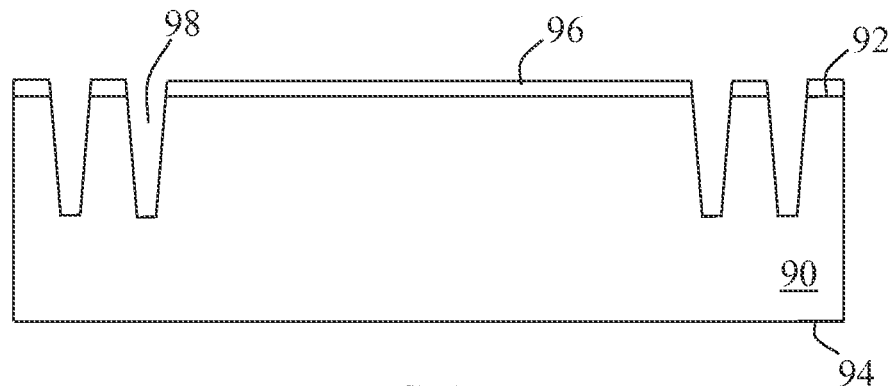

FIGS. 11-14 describe steps for forming components for an inertial sensor on side 14 of the first semiconductor substrate 10 while performing further steps for forming the pressure sensor. FIGS. 15-18 illustrate processing of a third semiconductor substrate 90 to form a cap for the inertial sensor. In FIG. 15, semiconductor substrate 90 is illustrated and may be of the type described above in relation to semiconductor substrate 10 and 60, and may be similar or identical to semiconductor substrates 10 and/or 60. As shown, semiconductor substrate 90 includes a planar surface at side 92 and a planar surface at an opposite side 94. In the context of FIG. 15, side 92 may be considered to be an "upper" side and side 94 may be considered to be a "lower" side.

In FIG. 15, a via etch process has been performed. Specifically, a mask 96 has been formed and patterned over side 92 of the semiconductor substrate 90. An exemplary mask 96 is an oxide hard mask. In an exemplary embodiment, the mask 96 is formed by CVD or oxidation. Then, blind vias 98 are etched into the semiconductor substrate 90. As shown, blind vias 98 extend through side 92 and toward side 94 of semiconductor substrate 90, but do not penetrate through to side 94 of semiconductor substrate 90. Blind vias 98 can be formed utilizing a number of conventionally-known processes, including deep reactive ion etching (DRIE).

Figure 16:
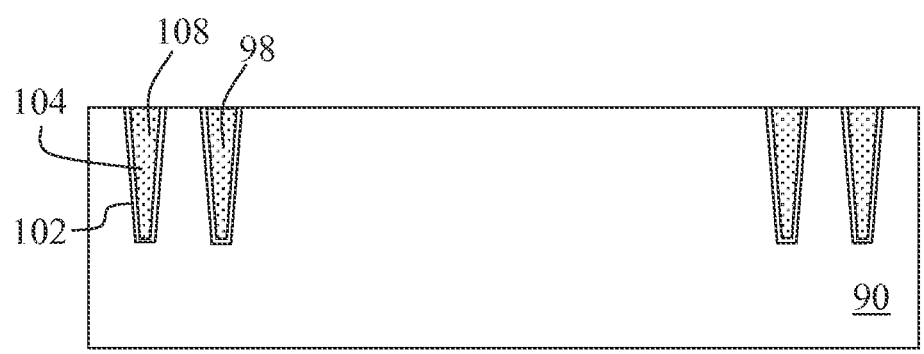

In FIG. 16, the mask 96 is removed and a liner 102 is formed on the side 92 of the semiconductor substrate 90, including within the blind vias 98. An exemplary liner 102 is formed by liner material, such as silicon oxide. In an exemplary embodiment, the liner material is deposited with a linear oxide deposition process, such as by CVD or LPCVD.

After formation of the liner 102, the method may continue with the deposition of a conductive material to form a conductive plug 104 within each blind via 98. An exemplary conductive material is in situ doped polysilicon. In an exemplary embodiment, the conductive material is deposited by an LPCVD process. The conductive material is deposited to fill the blind vias 98 and may form an overburden portion over the side 92 of the semiconductor substrate 90. In FIG. 16, the overburden portion of the conductive material and the liner 102 may be removed from over the side 92 of the semiconductor substrate 90 by CMP and oxide etch by a wet etch or plasma etch process. The liner 102 and conductive plug 104 may be considered to form a conductive interconnect 108 within each blind via 98.

Figure 17:
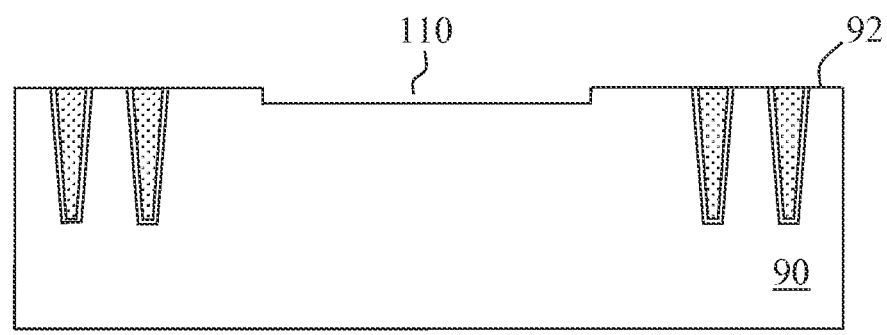

The method continues in FIG. 17 with a recess process. For example, a mask may be formed and patterned over side 92 of the semiconductor substrate 90. Then, an etch is performed, such as a plasma silicon etch. The exemplary etch process is anisotropic and forms cavity 110 in the semiconductor substrate 90. The mask may then be removed.

Figure 18:
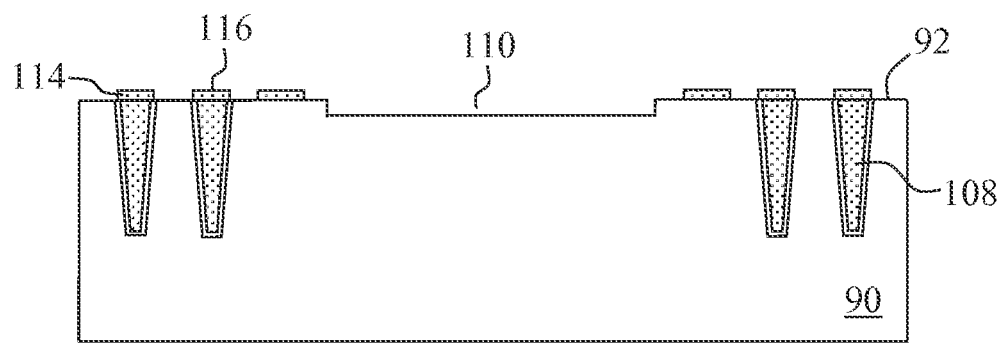

In FIG. 18, a bonding layer 114 is formed over side 92 of the semiconductor substrate 90. An exemplary bonding layer is formed from a bonding material such as aluminum. In an exemplary embodiment, the bonding material is deposited by PVD. After depositing the bonding material, a mask may be formed and patterned over the bonding material and the bonding material etched to form the bonding layer 114 as bonding segments 116. The mask is then removed. A bonding segment 116 may be located over each conductive interconnect 108

Figure 19:
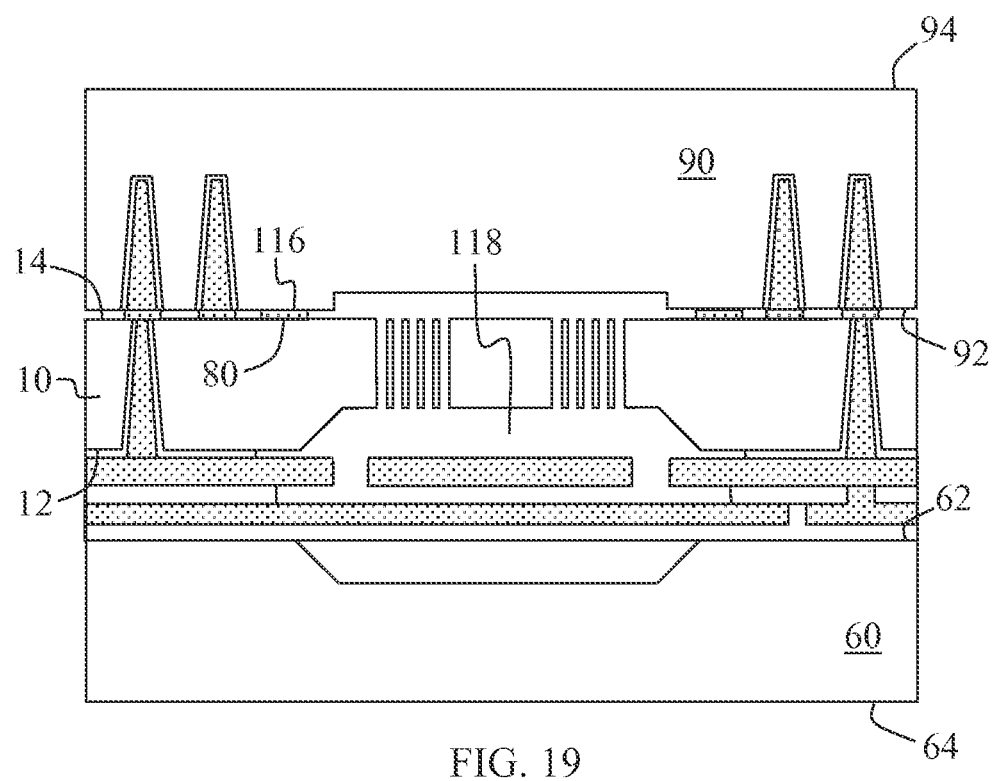

FIGS. 15-18 describe processing of the third semiconductor substrate 90. In FIGS. 19-23, the third semiconductor substrate 90 with the structure shown in FIG. 18 is bonded to the first semiconductor substrate 10 to form a monolithic semiconductor block for further processing. In FIG. 19, side 92 of the third semiconductor substrate 90 is bonded to side 14 of first semiconductor substrate 10. In an exemplary embodiment, third semiconductor substrate 90 and first semiconductor substrate 10 are bonded via eutectic bonding. Specifically, bonding segments 80 on side 14 of first semiconductor substrate 10 are aligned with bonding segments 116 on side 92 of third semiconductor substrate 90. In an exemplary embodiment, the materials forming bonding segments 80 and 116 are selected to form eutectic bond. As shown in FIG. 19, a vacuum cavity 118 is enclosed as a result of the eutectic bonding process.

Figure 20:
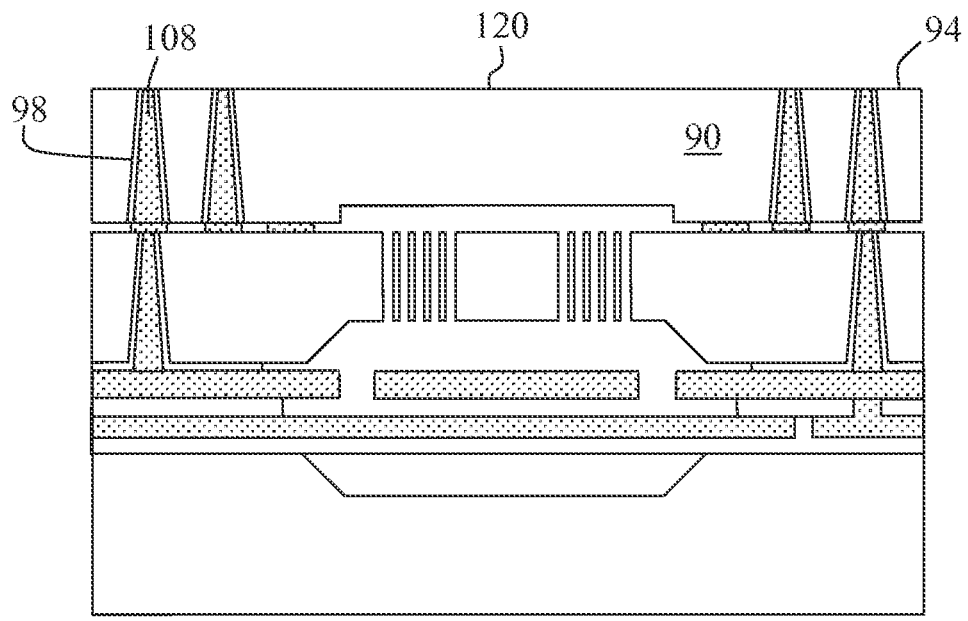

In FIG. 20, side 94 of semiconductor substrate 90 is recessed, such as by grinding or CMP, to a recessed surface 120. As shown, the recessed surface 120 intersects each blind via 98 and exposes the conductive interconnect 108 therein.

Figure 21:
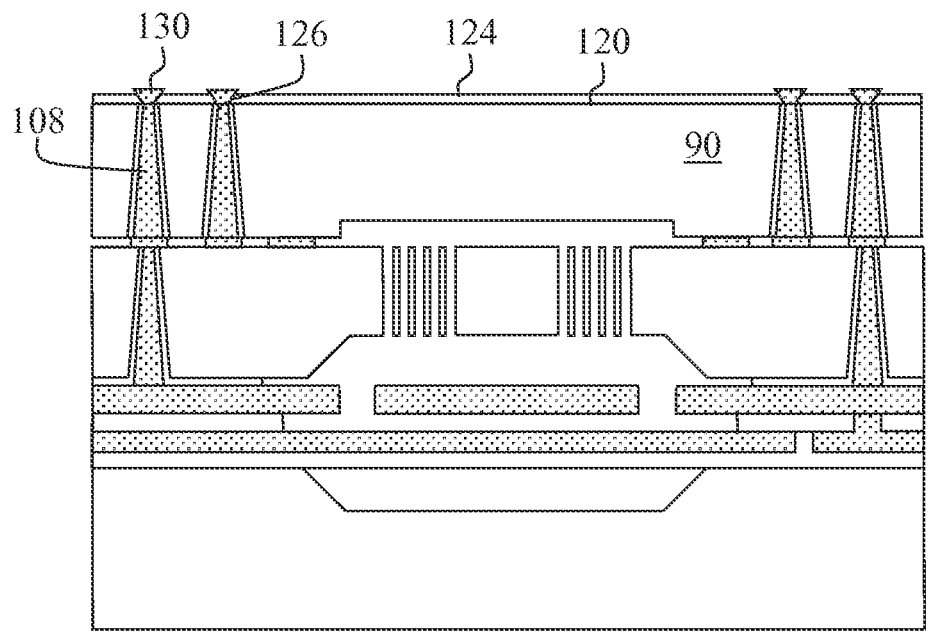

The method continues in FIG. 21 with forming a liner 124 on the recessed surface 120 of semiconductor substrate 90, including over the conductive interconnects 108. An exemplary liner 124 is formed by liner material, such as silicon oxide. In an exemplary embodiment, the liner material is deposited with by a CVD process. A mask is formed and patterned over the liner material. Then, an etch is performed, such as a plasma oxide etch or a wet etch. The etch process forms openings 126 in the liner 124 overlying the conductive interconnects 108.

As shown in FIG. 21, contact pads 130 are formed in the openings 126 and in electrical connection with the conductive interconnects 108. Exemplary contact pads 130 are formed from a contact material such as aluminum. In an exemplary embodiment, the contact material is deposited by a PVD process. A mask may be formed and patterned over the contact material and the contact material etched to form the contact pads 130 overlying the conductive interconnects 108. The mask is then removed.

Figure 22:
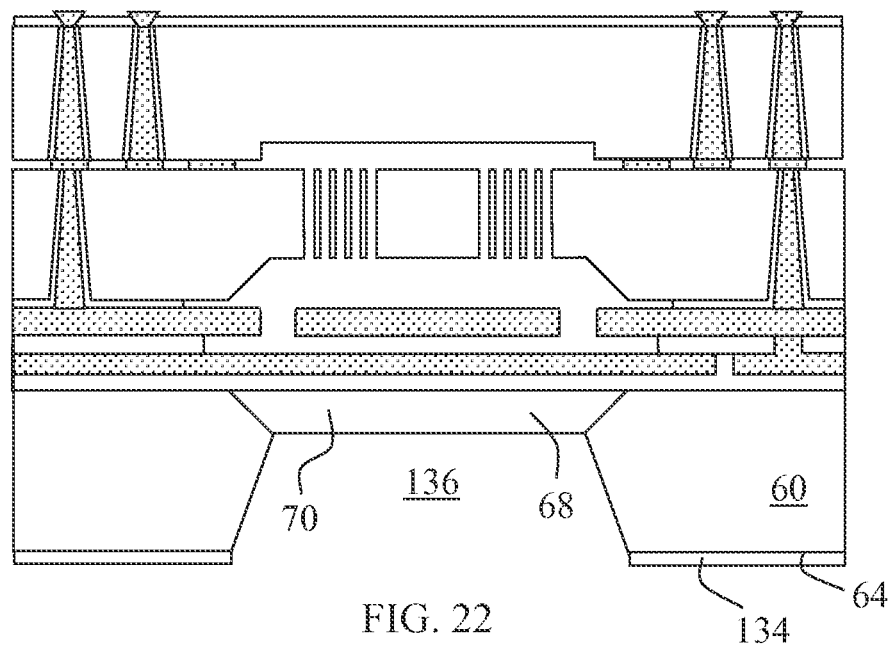

In FIG. 22, a hard mask 134 is formed and patterned on side 64 of semiconductor substrate 60. An exemplary mask 134 is an oxide hard mask. In an exemplary embodiment, the mask 134 is formed by CVD. Then, semiconductor substrate 60 is etched. As shown, the etch process forms a cavity 136 contacting trench 68 in semiconductor substrate 60 and exposing sacrificial material 70. An exemplary etch process is anisotropic, such as a DRIE process.

Figure 23:
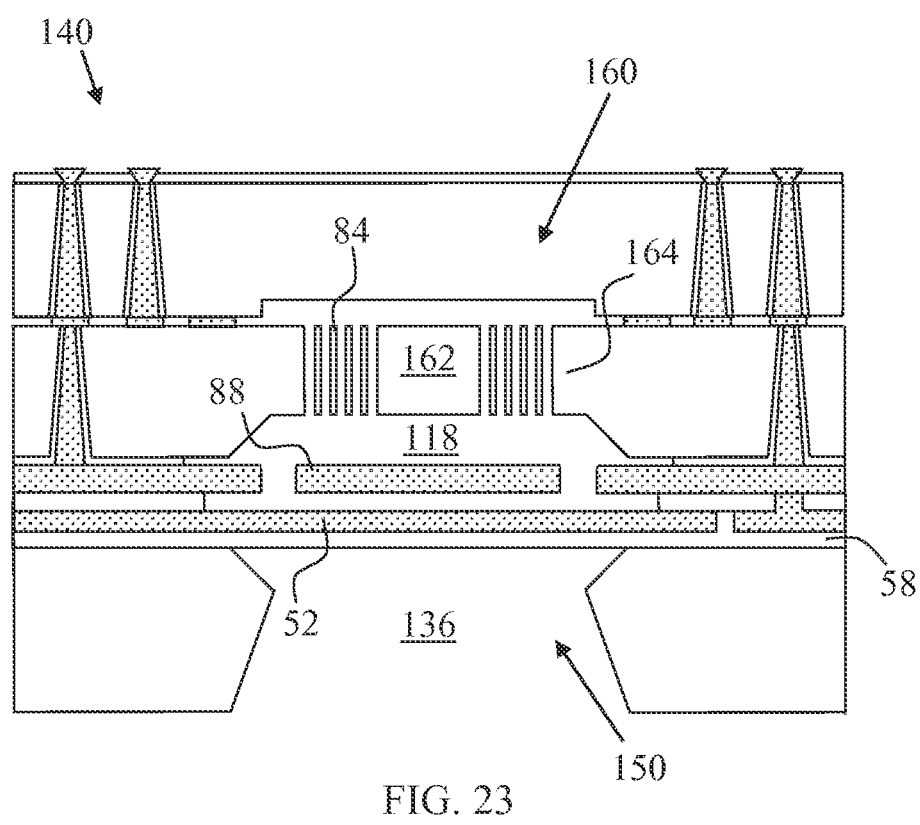

The method continues in FIG. 23 with the removal of sacrificial layer 70 and a portion of sacrificial layer 58. For example, for embodiments in which sacrificial layer 70 is oxide, an etch may be performed with VHF. As shown, with the removal of sacrificial layer 70 cavity 136 subsumes trench 68 and is extended into contact with membrane layer 52 and the remaining portions of sacrificial layer 58.

FIG. 23 illustrates an integrated device 140 including a MEMS pressure sensor 150 and a MEMS inertial sensor 160. The MEMS pressure sensor 150 is formed by the membrane layer 52 positioned between the cavity 136 and vacuum cavity 118, and by a backplate element 88 suspended in vacuum cavity 118. The MEMS inertial sensor 160 is formed by the moveable comb structure 88 and moveable proof mass 162 formed in the vacuum cavity 118, and anchor point 164. As shown, the MEMS pressure sensor 150 and MEMS inertial sensor 160 share the vacuum cavity 118. Further, the MEMS pressure sensor 150 and MEMS inertial sensor 160 are aligned vertically, i.e., one sensor is located over the other sensor. As a result, the chip size or footprint required for the integrated device 140 including a MEMS pressure sensor 150 and MEMS inertial sensor 160 is reduced.

As described in FIGS. 1-23, the methods provide for fabrication of a MEMS pressure sensor 150 on a side 12 of a semiconductor substrate 10 and fabrication of a MEMS inertial sensor 160 on the opposite side 14 of the semiconductor substrate 10. Further, the methods provide for enclosing a cavity 118 common to each sensor 150 and 160. It is noted that the methods may be used to provide a plurality of MEMS pressure sensors 150 on side 12 of the semiconductor substrate 10 and/or a plurality of MEMS inertial sensors 160 on the opposite side 14 of the semiconductor substrate 10. In one embodiment, integrated device 140 is formed with one MEMS pressure sensor 150 and at least two MEMS inertial sensors 160, for example, three MEMS inertial sensors 160.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating an integrated MEMS device for pressure and inertial sensing, the method comprising:
  forming a MEMS pressure sensor on a first side of a semiconductor substrate; and
  forming a MEMS inertial sensor on a second side of the semiconductor substrate, wherein the second side of the semiconductor substrate is opposite the first side of the semiconductor substrate.

2. The method of claim 1 further comprising:
  forming a membrane in the MEMS pressure sensor on the first side of the semiconductor substrate; and
  capping the second side of the semiconductor substrate with a cap to enclose a cavity between the membrane and the cap.

3. The method of claim 1 further comprising:
  forming a membrane in the MEMS pressure sensor on the first side of the semiconductor substrate; and
  capping the second side of the semiconductor substrate with a cap to enclose a vacuum cavity between the membrane and the cap.

4. The method of claim 3 wherein the semiconductor substrate is a first semiconductor substrate and wherein the method further comprises bonding a second semiconductor substrate to the first side of the first semiconductor substrate.

5. The method of claim 4 further comprising etching through the second semiconductor substrate to form an open cavity in communication with the membrane.

6. The method of claim 1 wherein forming the MEMS inertial sensor on the second side of the semiconductor substrate comprises etching the semiconductor substrate to form a moveable comb structure and moveable proof mass from the semiconductor substrate.

7. The method of claim 1 wherein the semiconductor substrate is a first semiconductor substrate and wherein the method further comprise:
  forming a membrane in the MEMS pressure sensor on the first side of the semiconductor substrate; and
  bonding a first side of a third semiconductor substrate to the second side of the semiconductor substrate to enclose a cavity between the membrane and the third semiconductor substrate.

8. The method of claim 7 further comprising:
  etching vias from the first side of the first semiconductor substrate to a second side of the third semiconductor substrate; and
  forming conductive interconnects from the first side of the first semiconductor substrate to the second side of the third semiconductor substrate.

9. The method of claim 1 wherein forming the MEMS pressure sensor on the first side of the semiconductor substrate comprises:
  forming a backplate member over a sacrificial layer in the first side of the semiconductor substrate; and
  forming a membrane over the backplate member.

10. The method of claim 9 wherein forming the MEMS inertial sensor on the second side of the semiconductor substrate comprises:
  etching through the semiconductor substrate to the sacrificial layer; and
  removing the sacrificial layer to form a comb structure and proof mass from the semiconductor substrate.

11. A method for fabricating a vertically integrated MEMS pressure sensor/inertial sensor device, the method comprising:
  providing a semiconductor substrate;
  processing a first side of the semiconductor substrate to form a MEMS pressure sensor; and
  processing a second side of the semiconductor substrate to form a MEMS inertial sensor.

12. The method of claim 11 wherein processing the first side of the semiconductor substrate and processing the second side of the semiconductor substrate comprises forming a cavity in the semiconductor substrate shared by the MEMS pressure sensor and the MEMS inertial sensor.

13. The method of claim 12 wherein the cavity is bound by a membrane formed on the first side of the semiconductor substrate and a cap formed on the second side of the semiconductor substrate.

14. The method of claim 11 wherein:
processing the first side of the semiconductor substrate to form the MEMS pressure sensor comprises forming a membrane on the first side of the semiconductor substrate; and
processing the second side of the semiconductor substrate to form the MEMS inertial sensor comprises forming cavity through the semiconductor substrate, wherein the cavity is bounded by the membrane and shared by the MEMS pressure sensor and the MEMS inertial sensor.

15. The method of claim 11 wherein the semiconductor substrate is a first semiconductor substrate and wherein the method further comprises:
bonding a second semiconductor substrate to the first side of the first semiconductor substrate; and
etching through the second semiconductor substrate to form an open cavity.

16. The method of claim 11 wherein processing the second side of the semiconductor substrate to form the MEMS inertial sensor comprises etching the semiconductor substrate to form a moveable comb structure and moveable proof mass from the semiconductor substrate.

17. The method of claim 11 wherein the semiconductor substrate is a first semiconductor substrate and wherein the method further comprises:
bonding a first side of a third semiconductor substrate to the second side of the first semiconductor substrate to enclose a cavity in the semiconductor substrate;
etching vias from the first side of the first semiconductor substrate to a second side of the third semiconductor substrate; and
forming conductive interconnects from the first side of the first semiconductor substrate to the second side of the third semiconductor substrate.

18. The method of claim 11 wherein processing the first side of the semiconductor substrate to form the MEMS pressure sensor comprises:
forming a backplate member over a sacrificial layer in the first side of the semiconductor substrate; and
forming a membrane over the backplate member.

19. The method of claim 18 wherein processing the second side of the semiconductor substrate to form the MEMS inertial sensor comprises:
etching through the semiconductor substrate to the sacrificial layer; and
removing the sacrificial layer to form a comb structure and proof mass from the semiconductor substrate.

20. An integrated MEMS device for pressure sensing and inertial sensing comprising:
a semiconductor substrate having a first side and a second side opposite the first side;
a MEMS pressure sensor located on the first side of the semiconductor substrate; and
a MEMS inertial sensor located on the second side of the semiconductor substrate.

* * * * *